US010279702B2

(12) United States Patent
Koo et al.

(10) Patent No.: US 10,279,702 B2
(45) Date of Patent: May 7, 2019

(54) TECHNIQUE OF DIAGNOSING FUEL CELL STACK (71) Applicants: Hyundai Motor Company, Seoul (KR); Kia Motors Corporation, Seoul (KR)

(72) Inventors: Ja Hoo Koo, Gyeonggi-do (KR); Sung Jin Chung, Gyeonggi-do (KR); Sang Uk Kwon, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 21 days.

(21) Appl. No.: 15/867,244

(22) Filed: Jan. 10, 2018

(65) Prior Publication Data
US 2018/0126865 A1    May 10, 2018

Related U.S. Application Data (63) Continuation-in-part of application No. 14/331,589, filed on Jul. 15, 2014, now abandoned.

(30) Foreign Application Priority Data

Dec. 17, 2013    (KR) .................. 10-2013-0157642

(51) Int. Cl.
B60L 11/18    (2006.01)
H01M 8/04992    (2016.01)
(Continued)

(52) U.S. Cl.
CPC ...... *B60L 11/1881* (2013.01); *G01R 31/3648* (2013.01); *H01M 8/0494* (2013.01);
(Continued)

(58) Field of Classification Search
CPC .................................................. B60L 11/1881
(Continued)

(56) References Cited

U.S. PATENT DOCUMENTS 6,461,751 B1 *   10/2002   Boehm ............. H01M 8/04089
                                                  429/432
2004/0161657 A1 *   8/2004   Simpson ........... H01M 8/04231
                                                  429/413
(Continued)

FOREIGN PATENT DOCUMENTS

| JP | 2002-352827 A | 12/2002 |
| JP | 2005-032587 A | 2/2005 |
| JP | 2006-049128 A | 2/2006 |
| JP | 2011-100564 A | 5/2011 |
| KR | 10-2013-0026274 A | 3/2013 |
| WO | 2009113203 A1 | 9/2009 |

*Primary Examiner* — Ricky Ngon
(74) *Attorney, Agent, or Firm* — Mintz Levin Cohn Ferris Glovsky and Popeo, P.C.; Peter F. Corless (57) ABSTRACT A technique of diagnosing a fuel cell stack is provided. In particular, current and voltage of a fuel cell stack are measured during driving of a fuel cell vehicle and the current and voltage are sequentially stored. It is then determined based on the stored current whether the vehicle is being operated at constant current. Different factors are analyzed depending on whether the vehicle is being operated at constant current, and then it is determined whether the fuel cell stack is in a normal state. A moisture supply into the fuel cell stack is calculated if it is determined that the fuel cell stack is not in the normal state. Based on the calculated moisture supply, whether the fuel cell stack is in a dryout state is diagnosed.

18 Claims, 4 Drawing Sheets

(51) Int. Cl.
*H01M 8/04537* (2016.01)
*H01M 8/0432* (2016.01)
*G01R 31/36* (2019.01)
*H01M 8/04664* (2016.01)
*H01M 8/04492* (2016.01)
*H01M 8/04828* (2016.01)
*H01M 8/04746* (2016.01)

(52) U.S. Cl.
CPC ... *H01M 8/04365* (2013.01); *H01M 8/04492* (2013.01); *H01M 8/04529* (2013.01); *H01M 8/04559* (2013.01); *H01M 8/04589* (2013.01); *H01M 8/04649* (2013.01); *H01M 8/04679* (2013.01); *H01M 8/04753* (2013.01); *H01M 8/04835* (2013.01); *H01M 8/04992* (2013.01); *H01M 2250/20* (2013.01); *Y02T 90/32* (2013.01); *Y02T 90/34* (2013.01)

(58) Field of Classification Search
USPC .......................................................... 702/63
See application file for complete search history.

(56) References Cited

U.S. PATENT DOCUMENTS

| | | | |
|---|---|---|---|
| 2005/0287402 A1* | 12/2005 | Maly | H01M 8/04291 702/65 |
| 2006/0040149 A1* | 2/2006 | Aso | H01M 8/04268 429/428 |
| 2009/0191437 A1* | 7/2009 | Maeshima | H01M 8/04029 429/434 |
| 2009/0267556 A1* | 10/2009 | Koike | B60L 11/1881 318/434 |
| 2010/0141262 A1 | 6/2010 | Watanabe et al. | |
| 2010/0221630 A1* | 9/2010 | Kajiwara | H01M 8/04313 429/443 |
| 2011/0091781 A1* | 4/2011 | Folmsbee | H01M 8/00 429/413 |
| 2014/0162159 A1* | 6/2014 | Lebzelter | H01M 8/04679 429/432 |
| 2015/0153418 A1* | 6/2015 | Prenninger | G01R 31/3662 702/63 |

* cited by examiner

TECHNIQUE OF DIAGNOSING FUEL CELL STACK

CROSS-REFERENCE(S) TO RELATED APPLICATION

This application is a Continuation in Part of U.S. application Ser. No. 14/331,589 filed on Jul. 15, 2014, which claims priority of Korean Patent Application Number 10-2013-0157642 filed on Dec. 17, 2013, the entire contents of which are incorporated herein for all purposes by this reference.

BACKGROUND OF THE INVENTION

1. Field of the Invention

The present invention relates, in general, to a method of diagnosing a fuel cell stack and, more particularly, to a method of diagnosing a fuel cell stack, which can improve the durability of fuel cells.

2. Description of the Related Art

A fuel cell vehicle typically includes a fuel cell stack in which a plurality of fuel cells used as a power source are stacked one on top of another, a fuel supply system for supplying hydrogen or the like which is fuel to the fuel cell stack, an air supply system for supplying oxygen which is an oxidizing agent required for an electrochemical reaction, and a water and heat management system for controlling the temperature of the fuel cell stack.

The fuel supply system decompresses compressed hydrogen within a hydrogen tank and supplies the decompressed hydrogen to the fuel electrode (anode) of the stack, and the air supply system supplies external air inhaled by operating an air blower and supplies the air to the air electrode (cathode) of the stack.

When hydrogen or the like is supplied to the fuel electrode of the stack, and oxygen is supplied to the air electrode, hydrogen ions are separated from the fuel electrode via a catalytic reaction. The separated hydrogen ions are transferred to an oxidation electrode, which is the air electrode, through an electrolyte membrane. In the oxidation electrode, the hydrogen ions separated from the fuel electrode, electrons, and oxygen cause an electrochemical reaction, and thus electrical energy is acquired via this electrochemical reaction. In detail, the electrochemical oxidation of hydrogen occurs in the fuel electrode, the electrochemical reduction of oxygen occurs in the air electrode, electricity and heat are produced due to the movement of electrons generated in such oxidation and reduction, and vapor or water is formed due to a chemical action in which hydrogen and oxygen are combined.

In order to discharge by-products such as vapor, water, and heat which are formed during generation of electrical energy of a fuel cell stack, and hydrogen and oxygen which do not react, a discharge device is often provided, and gases such as vapor, hydrogen, and oxygen are discharged to atmosphere via an exhaust passage.

In such as system, components such as an air blower, a hydrogen recirculation blower, and a water pump, required to drive a fuel cell are connected to a main bus terminal and facilitate the starting of the fuel cell. Additionally, various types of relays for facilitating the interruption and connection of power and a diode for preventing reverse current from flowing into the fuel cell may be connected to the main bus terminal as well.

Dry air supplied through the air blower is humidified by a humidifier, and is supplied to the cathode (air electrode) of the fuel cell stack, and exhaust gas of the cathode may be delivered to the humidifier in a humidified state due to water components generated therein and may be used to humidify dry air to be supplied to the cathode via the air blower.

Conventionally, a fuel cell stacks have been known to sensitively react to operating conditions, that is, external air temperature, coolant temperature, use current, etc. As such, the state and performance thereof are determined. During bad or poor operating conditions, if the vehicle is continuously driven, the performance of the fuel cell stack loses power quickly, and thus the power required by a driver provided. Also as a result, the durability of the stack is deteriorated over the long term, and thus the lifespan of the fuel cell stack is shortened as a result.

Commonly, dryout of the stack is often caused by two factors, one being dryout occurring during high temperature and high power conditions, and the other being dryout occurring at low power conditions. Dryout at high temperatures and high power often occurs when heat balance of the inside of the stack is lost. In addition, dryout at low power often occurs when air is supercharged.

Regardless, when the dryout of the fuel cell stack occurs, the power of the fuel cell stack is decreased, and a significant amount of time passes before the power returns to normal power. Therefore, there is a need to sense that a dryout situation of the fuel cell stack is occurring and control the fuel cell system so that, if the dryout situation is found to have occurred, a stack recovery operation is performed, and the fuel cell stack can be promptly recovered.

Some known methods of determining the dryout of a fuel cell stack include Current Interrupt (CI) methods and Electrochemical Impedance Spectroscopy (EIS) methods. However, such methods are disadvantageous in that, since they uses a specific current band, it is difficult to apply these methods in real time during vehicle operation, and there is a need to additionally mount high-performance (and expensive) hardware, thus making it difficult to apply the method to low cost vehicles.

SUMMARY OF THE INVENTION

Accordingly, the present invention has been made keeping in mind the above problems occurring in the prior art, and an object of the present invention is to provide a system and method of diagnosing a fuel cell stack, which senses the deterioration in the performance of the fuel cell stack attributable to the dryout or the long-term deterioration of durability of the fuel cell stack, and as a result executes a recovery operation.

In order to accomplish the above object, the present invention provides a system and method of diagnosing a fuel cell stack, including measuring, by a processor, a current and a voltage of a fuel cell stack during operation of a fuel cell vehicle and sequentially storing, on a memory, the current and voltage; determining, by the processor based on the stored current in the memory, whether the vehicle is operating at constant current; analyzing, by the processor, different factors depending on whether the vehicle is being operated at constant current, and in response, determining whether the fuel cell stack is in a normal state; calculating, by the processor, a moisture supply into the fuel cell stack when the processor determines that the fuel cell stack is not in the normal state; and diagnosing, by the processor based on the calculated moisture supply, whether the fuel cell stack is in a dryout state.

Additionally, in some exemplary embodiments of the present invention, determining whether the vehicle is being operated at constant current may include the processor being configured to determine, based on a variance of the stored current, whether the vehicle is being driven at constant current.

Preferably, in some exemplary embodiments of the present invention determining whether the fuel cell stack is in the normal state may be include the processor being configured to, when the processor determines that the vehicle is not being driven at constant current, calculate an internal resistance from a relationship between the current and the voltage stored in the memory and determine whether the calculated internal resistance is greater than a preset reference resistance. As such, preferably, in some exemplary embodiments of the present invention, calculating the moisture supply into the fuel cell stack may be performed when the calculated internal resistance is greater than the preset reference resistance.

Furthermore, determining whether the fuel cell stack is in the normal state may include the processor being configured to, when the processor determines that the vehicle is being driven at constant current, measure a variation in an output voltage level of the fuel cell stack and determine whether the measured variation in the output voltage level is greater than a preset variation. As such, in this exemplary embodiment of the present invention, calculating the moisture supply into the fuel cell stack may be performed when the measured variation in the output voltage level is greater than the preset variation.

Preferably, the moisture supply into the fuel cell stack may be calculated by integrating excessive or deficient moisture content obtained for a predetermined period of time. In particular, excessive or deficient moisture content may be based on a moisture supply, a moisture discharge, and moisture content generated due to a chemical reaction within the fuel cell stack.

In yet further embodiments of the present invention, diagnosing whether the fuel cell stack is in the dryout state include the processor being configured to diagnose that the fuel cell stack is in the dryout state when the moisture supply into the fuel cell stack is greater than a preset moisture supply, and to diagnose that the fuel cell stack is deteriorated when the moisture supply into the fuel cell stack is less than a preset moisture supply.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Specific structural or functional descriptions related to embodiments of the present invention and disclosed in the present specification or application are merely illustrated to describe embodiments of the present invention, and the embodiments of the present invention may be implemented in various forms and should not be interpreted as being limited to the above embodiments described in the present specification or application.

The embodiments of the present invention may be modified in various manners and may have various forms, so that specific embodiments are intended to be illustrated in the drawings and described in detail in the present specification or application. However, it should be understood that those embodiments are not intended to limit the embodiments based on the concept of the present invention to specific disclosure forms and they include all changes, equivalents or modifications included in the spirit and scope of the present invention.

The terms such as "first" and "second" may be used to describe various components, but those components should not be limited by the terms. The terms are merely used to distinguish one component from other components, and a first component may be designated as a second component and a second component may be designated as a first component in the similar manner, without departing from the scope based on the concept of the present invention.

Throughout the entire specification, it should be understood that a representation indicating that a first component is "connected" or "coupled" to a second component may include the case where the first component is connected or coupled to the second component with some other component interposed therebetween, as well as the case where the first component is "directly connected" or "directly coupled" to the second component. In contrast, it should be understood that a representation indicating that a first component is "directly connected" or "directly coupled" to a second component means that no component is interposed between the first and second components.

Other representations describing relationships among components, that is, "between" and "directly between" or "adjacent to," and "directly adjacent to," should be interpreted in similar manners.

The terms used in the present specification are merely used to describe specific embodiments and are not intended to limit the present invention. A singular expression includes a plural expression unless a description to the contrary is specifically pointed out in context. In the present specification, it should be understood that the terms such as "include" or "have" are merely intended to indicate that features, numbers, steps, operations, components, parts, or combinations thereof are present, and are not intended to exclude a possibility that one or more other features, numbers, steps, operations, components, parts, or combinations thereof will be present or added.

Unless differently defined, all terms used here including technical or scientific terms have the same meanings as the terms generally understood by those skilled in the art to which the present invention pertains. The terms identical to those defined in generally used dictionaries should be interpreted as having meanings identical to contextual meanings of the related art, and are not interpreted as being ideal or excessively formal meanings unless they are definitely defined in the present specification.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid fuel cell vehicles, electric fuel cell vehicles, plug-in hybrid electric fuel cell vehicles, hydrogen-powered fuel cell vehicles, and all other types of fuel cell vehicles. As referred to herein, a hybrid vehicle is a vehicle that has two or more sources of power, for example both gasoline-powered and electric-powered vehicles.

Additionally, it is understood that the below methods are executed by at least one controller. The term controller refers to a hardware device that includes a memory and a processor configured to execute one or more steps that should be interpreted as its algorithmic structure. The memory is configured to store algorithmic steps and the processor is specifically configured to execute said algorithmic steps to perform one or more processes which are described further below.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

Hereinafter, the present invention will be described in detail by describing embodiments of the present invention with reference to the attached drawings. The same reference numerals are used throughout the different drawings to designate the same or similar components.

Figure 1:
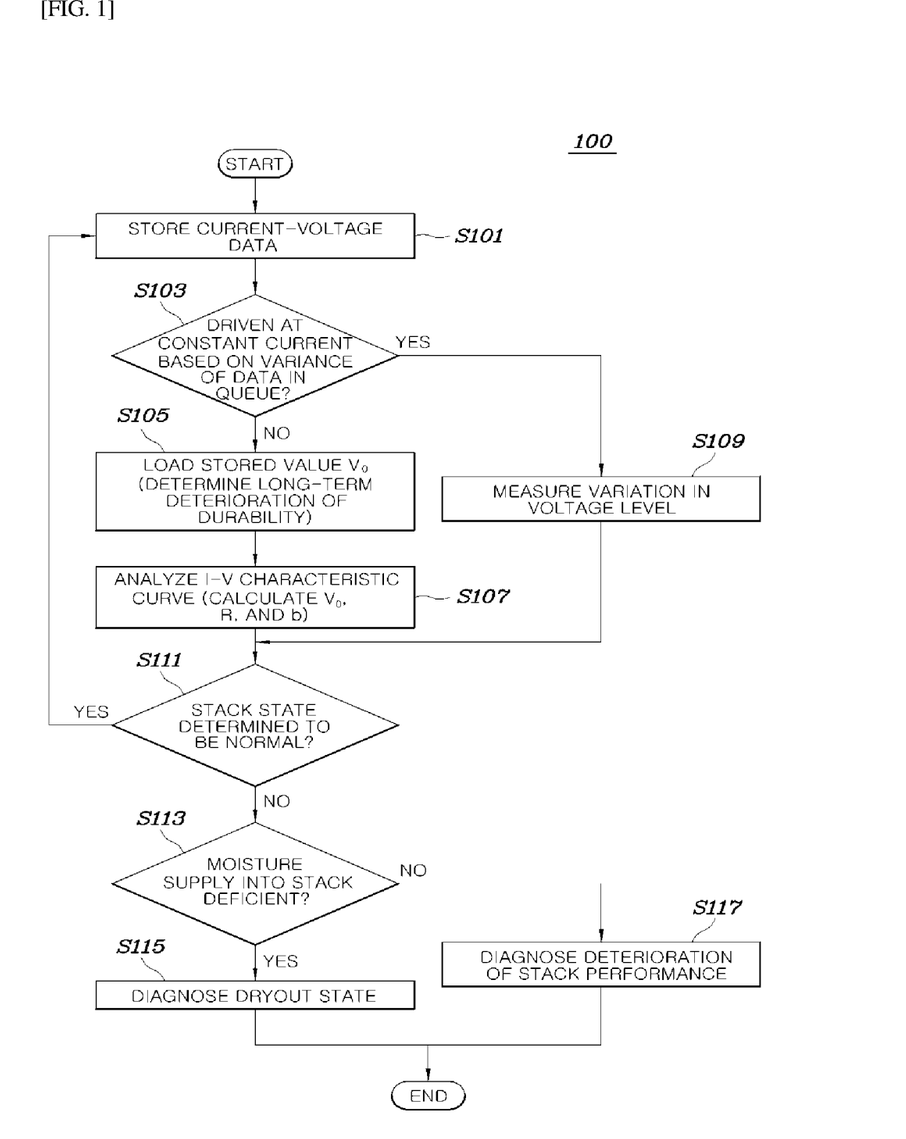
FIG. 1 is a flowchart showing a method of diagnosing a fuel cell stack according to an exemplary embodiment of the present invention.

FIG. 1 is a flowchart showing a method of diagnosing a fuel cell stack according to an embodiment of the present invention that may be implemented on an executed by a controller including at least a processor and a memory. The method of diagnosing a fuel cell stack according to the exemplary embodiment of the present invention may include measuring, by a processor connected to e.g., a sensor, the current and voltage of the fuel cell stack during the driving of a fuel cell vehicle and sequentially storing the current and voltage, determining, by the processor based on the current stored in the memory, whether the vehicle is being operated at constant current, and analyzing, by the processor, different factors depending on whether the vehicle is being operated at constant current, and determining, by the processor, whether the fuel cell stack is in a normal state. When it is determined that the fuel cell stack is not in a normal state, a moisture supply into the fuel cell stack is calculated by the processor, and whether the fuel cell stack is in a dryout state is diagnosed by the processor based on the calculated moisture supply.

During the operation of the fuel cell vehicle, the current and voltage of the fuel cell stack may be stored in a queue in a memory having a predetermined size at step S101. The size of the queue may be determined in consideration of precision of analysis of current and voltage value data and the memory capacity of the controller within the fuel cell vehicle.

Depending on whether the vehicle is being operated at constant current, if the fuel cell vehicle is currently being operated at constant current, a variation in an output voltage level is measured at step S109. The processor then analyzes whether the variation in the output voltage level is greater than a preset variation. If the fuel cell vehicle is not currently being operated at constant current, the processor may then determine whether long-term deterioration of durability of the fuel cell stack has occurred, based on an initial output voltage which is previously stored at step S105. Thereafter, a current-output voltage characteristic curve may be analyzed as a result of this data at step S107. The variation in the output voltage level is compared with a preset variation and is analyzed, and the internal resistance or the like is analyzed based on the current-output voltage characteristic curve, and thus the current state of the fuel cell stack may be determined at step S111. That is, the processor determines whether the fuel cell vehicle is currently being operated at constant current, and different factors (e.g., internal resistance or output voltage level calculated based on current and output voltage) are analyzed based on the results of the determination, and thus it may be determined whether the fuel cell stack is in a normal state at step S111.

Determination of whether the fuel cell vehicle is currently being operated at constant current may be performed based on the variance of the stored current at step S103. The variance of the current stored in the queue is calculated, and determination is performed such that, when the current variance is small (e g, less than a defined value), it may be determined that the vehicle is being operated at constant current, whereas when the current variance is large (e.g., greater than the defined value), it may be determined that the vehicle is not being operated at constant current. The smallness/largeness of the variance may be alternatively determined based on whether the variance falls within a defined range of variances in which constant current driving may be determined. That is, if the variance falls within the set defined range of variances, it may be determined that the vehicle is being operated at constant current, whereas if the variance falls out of the set range, it is determined that the vehicle is not being operated at constant current.

By loading a stored initial voltage $V_o$, the deterioration degree of durability of the fuel cell stack may be determined at step S105. The characteristic curve of the fuel cell stack may be represented by the equation $V=V_o-b\log(I)-RI$, where V denotes a present output voltage, I denotes a present current, and R denotes an internal resistance. In the current-voltage characteristic curve, $V_o$ denotes the initial voltage while being a y-intercept value.

That is, when the fuel cell vehicle is not currently being operated at constant current, the case where it is determined that the deterioration of performance of the fuel cell stack is not caused by temporary dryout may be excluded based on the value $V_o$ calculated when the fuel cell vehicle was previously operated. That is, the short-term deterioration of performance of the fuel cell stack and the long-term deterioration of durability of the fuel cell stack may be distinguished from each other to some degree.

The determination of whether the fuel cell stack is in the normal state may be performed by calculating internal resistance R from a relationship between current and voltage when the fuel cell vehicle is not being operated at constant current, and determining whether the calculated internal resistance is greater than a preset reference resistance. That is, it may be determined that, when the calculated internal resistance is greater than the reference resistance value, the output performance of the fuel cell stack has deteriorated, whereas when the calculated internal resistance value is less than the preset reference resistance value, the output performance of the fuel cell stack is in a normal state (i.e., operating normally).

The determination of whether the fuel cell stack is in the normal state may be performed by measuring a variation in the output voltage level of the fuel cell stack in the case of constant current driving and determining whether the measured variation in the voltage level is greater than a preset variation. That is, it may be determined that, if the measured variation in the voltage level is greater than the preset variation, the output performance of the fuel cell stack has deteriorated. Whereas, if the measured variation in the voltage level is less than the preset variation, the output performance of the fuel cell stack is in the normal state in which the output performance of the fuel cell stack is not deteriorated. This may be seen from a graph shown in FIG. 4. That is, even if the current of the fuel cell stack is identical, when the output voltage is decreased, this is due to the deterioration of the performance of the fuel cell stack.

If the fuel cell stack is determined not to be in the normal state, that is, if the internal resistance is greater than the preset resistance or if the variation in the voltage level measured during constant current driving is greater than a preset variation, a moisture supply into the fuel cell stack is calculated, and whether the moisture supply is deficient may be determined at step S113. That is, when the fuel cell stack is not in the normal state, the moisture supply of the fuel cell stack is calculated. If the moisture supply is deficient, the processor may diagnose that the fuel cell stack is in a dryout state at step S115. That is, whether the fuel cell stack is in the dryout state may be diagnosed based on the calculated moisture supply at step S115. Even if the fuel cell stack is not in the normal state, if the moisture supply in the fuel cell stack is not deficient, it may be diagnosed that the performance of the fuel cell stack is deteriorated due to the degradation of the fuel cell stack attributable to anode poisoning or the like at step S117.

The moisture supply into the fuel cell stack is calculated by integrating excessive or deficient moisture content obtained over a predetermined period of time, and such excessive or deficient moisture content may be provided by collectively considering a moisture supply, a moisture discharge, and moisture content generated due to a chemical reaction within the fuel cell stack. When the moisture supply is deficient, and the fuel cell stack is diagnosed as being in a dryout state, recovery driving control may be executed for the fuel cell stack.

Recovery driving control includes a method of controlling a cooling system of the fuel cell stack, a method of controlling output of the fuel cell, and a method of controlling an air supply system.

First, a method of controlling the cooling system of the fuel cell stack is to forcibly cool the fuel cell stack to recover the dry-out of the fuel cell stack. In order to increase the relative humidity inside of the fuel cell stack, the cooling system is controlled to cool the fuel cell stack. Specifically, the rotation speed of the pump for circulating a coolant or the rotation speed of the cooling fan for cooling the radiator can be increased, or the bypass flow path can be controlled to increase flow rate of the coolant circulated through the radiator.

In addition, as a method of controlling an output of the fuel cell, the output of the fuel cell is controlled such that a low output state of the fuel cell is avoided. The fuel cell stack is often deteriorated in a low output state, and deterioration can be recovered in a high output state. Specifically, control is performed to maintain the high output state of the fuel cell with control of power consumption, such as controlling a bidirectional high voltage DC/DC converter to charge a high voltage battery, or increasing power consumption of resistors and BOP devices. Therefore, it is possible to control the fuel cell to the high output state to recover the dry out.

The method of controlling an air supply system for supplying air to the fuel cell stack can control to increase a humidity of air supplied to the fuel cell stack or to decrease the air supply flow rate. Specifically, to increase the water supply amount to the inside of the fuel cell stack, the humidity of air supplied to the fuel cell stack may be increased by controlling an humidifier to supply more water to air supplied to the fuel cell stack.

In addition, the flow rate of the air supplied to the fuel cell stack can be decreased or blocked. The dry-out of the fuel cell stack often occurs when the air is excessively supplied to the fuel cell stack. Therefore, to recover the dry-out of the fuel cell stack, it is possible to control with a minimum air SR (Stoichiometry Ratio) so that the flow rate of the air supplied to the fuel cell stack is minimized.

An air blower can be decelerated rapidly so that more air is not supplied than the required air supply to the fuel cell stack. That is, when the required air supply amount is decreased, the air blower can be regenerative braked to minimize the time required for deceleration of the air blower rotational speed, thereby preventing the excessive supply of air in comparison with the required air supply amount.

Also, it is possible to block the air supply to the fuel cell by controlling the fuel cell to power generation stop mode (FC Stop Mode). Specifically, when the required power of the fuel cell is low or the charge amount of the high-voltage battery (SOC) is sufficient, the fuel cell can be controlled so that stops power generation instead of operating at low output state. Thus, the air flow rate supplied to the fuel cell can be minimized, and the low output state of the fuel cell is avoided.

Figure 2A:
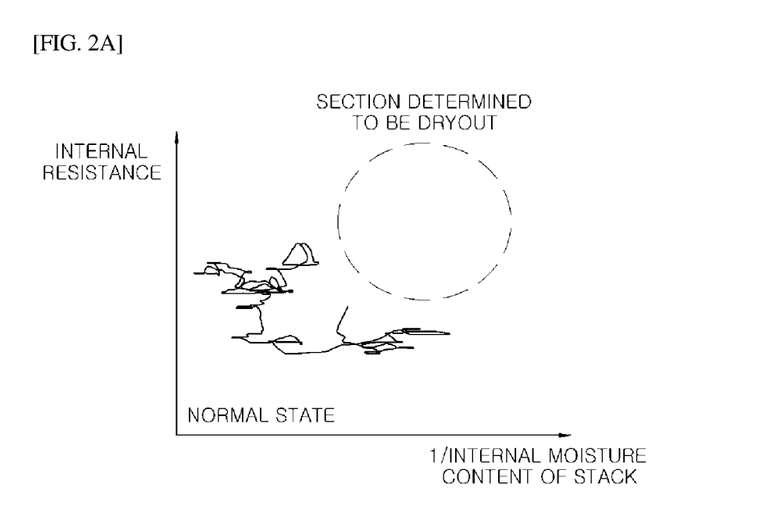
FIGS. 2A and 2B are graphs showing relationships between the internal moisture content and internal resistance of a fuel cell stack and the dryout state of the fuel cell stack of the exemplary embodiments of the present invention.
Figure 2B:
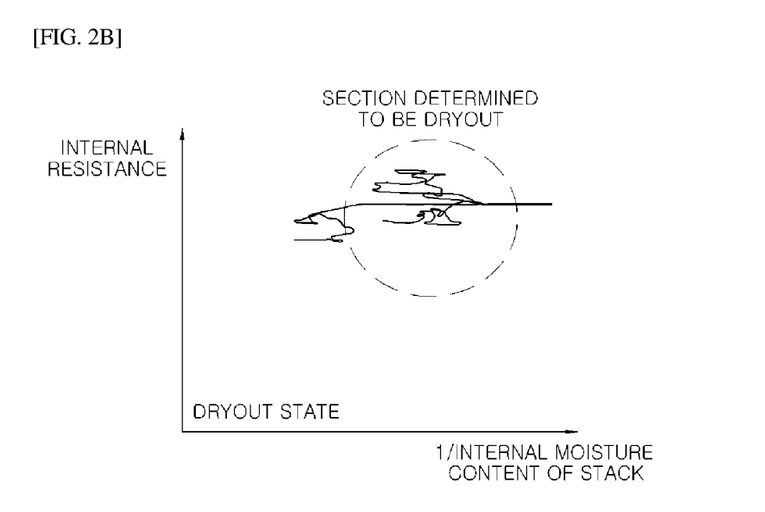

FIGS. 2A and 2B are graphs showing relationships between the internal moisture content and internal resistance of a fuel cell stack and the dryout state of the fuel cell stack. Referring to FIGS. 2A and 2B, FIG. 2A illustrates a relationship between the internal moisture content and the internal resistance of a fuel cell stack which is in the normal state and the dryout state of the fuel cell stack, and FIG. 2B illustrates a relationship between the internal moisture content and the internal resistance of the fuel cell stack which is in the dryout state and the dryout state of the fuel cell stack. Referring to FIG. 2A, a section of the graph identified by a circular section is provided is a disposition where the moisture content in the stack is small and the internal resistance is large. As can be seen from the graph, however, in this instances the moisture content in the stack is small, and the internal resistance is also small and thus the fuel cell stack at this point in time may be regarded as being in the normal state. Referring to FIG. 2B, since the moisture content in the stack is small, and the internal resistance is large and thus falls within the section identified on the graph, the fuel cell stack at this time may be regarded as being in a dryout state.

Figure 3:
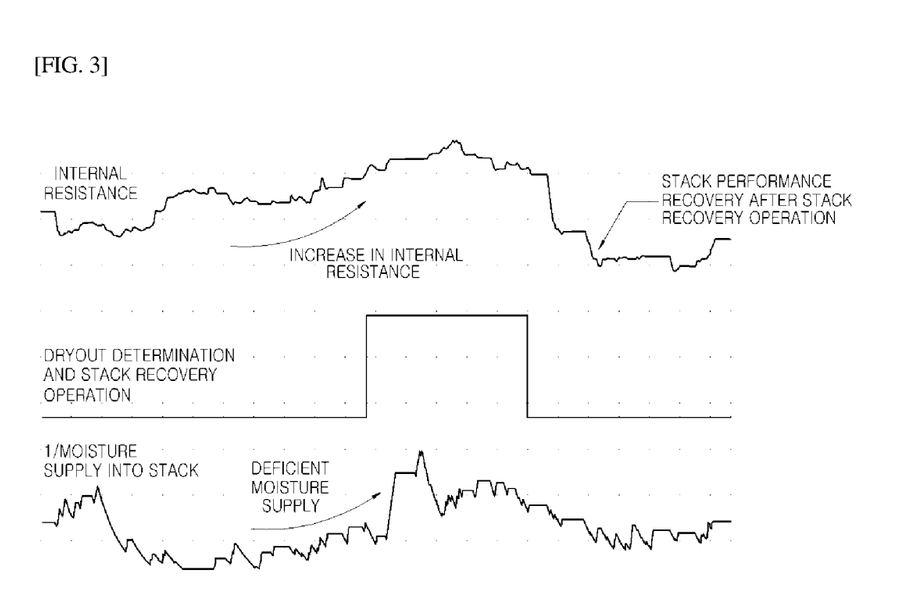
FIG. 3 is a graph showing a moisture supply into the fuel cell stack, the internal resistance of the fuel cell stack, and determination of dryout due to them, and variations in the moisture supply and the internal resistance depending on the recovery operation of the fuel cell stack of the exemplary embodiments of the present invention.

FIG. 3 is a graph illustrating moisture supply into the fuel cell stack, the internal resistance of the fuel cell stack, and determination of dryout due to these factors. Additionally, variations in the moisture supply and the internal resistance depending on the recovery operation of the fuel cell stack is also shown. Referring to FIG. 3, when the moisture supply into the stack is deficient, and the internal resistance of the fuel cell stack increases, the fuel cell stack is determined to be in a dryout state. Then, if a stack recovery operation is executed by the controller/fuel cell system, a moisture supply into the fuel cell stack is reduced, and the internal resistance is also reduced. As a result, the fuel cell stack may return to the normal state.

Figure 4:
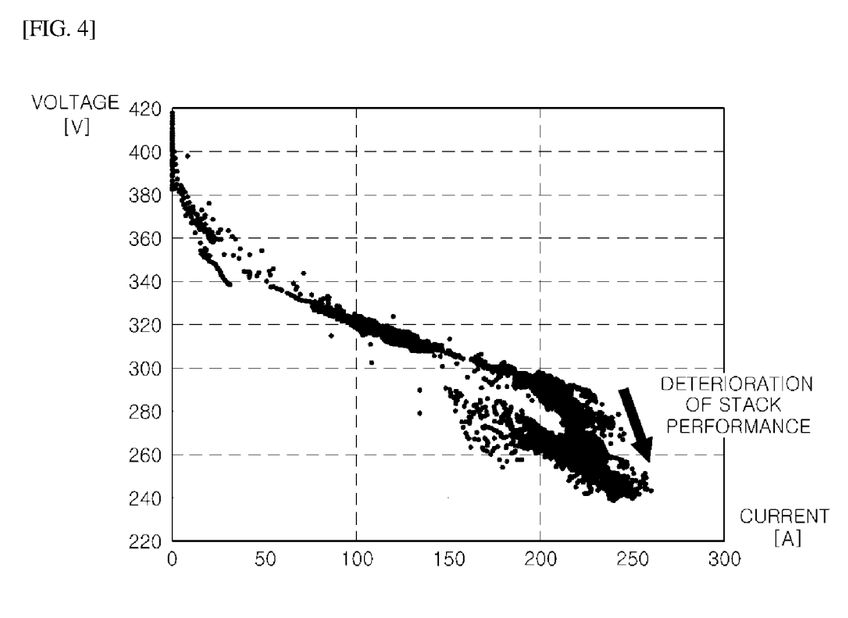
FIG. 4 is a graph showing variations in the level of an output voltage during constant current driving of the exemplary embodiments of the present invention.

FIG. 4 is a graph illustrating variations in an output voltage level during constant current operation. As described above, when the fuel cell vehicle is being operated at constant current, variations in the voltage level of an output voltage are observed, and thus it may be determined whether the fuel cell stack is currently operating in a normal state. When the vehicle is being operated at constant current, a situation may occur where a Persistence of Excitation (PE) condition of current-voltage data is not satisfied and then current-voltage data cannot be analyzed. Therefore, by analyzing the variations in a voltage level output during constant current operation, the state of the fuel cell stack may be diagnosed effectively. In the past, since only a voltage for a specific current is monitored, it was impossible to diagnose the stack when the corresponding current is not being used. In contrast, the present invention may continuously diagnose whether a fuel cell stack is in a normal state whether or not current is being utilized because a specific current is not designated, and a voltage variation can be checked instead.

As described above, a method of diagnosing a fuel cell stack according to the exemplary embodiments of the present invention is advantageous in that it may diagnose the state of a fuel cell stack using only voltage-current data obtained while operating a fuel cell vehicle, without using a sensor having high resolution and a high-sampling frequency and a data analysis device. Further, the present invention is advantageous in that voltage-current data is analyzed in real time, thus immediately coping with the deterioration of performance of a fuel cell stack. Furthermore, the present invention is advantageous in that the degree of long-term deterioration of durability of a fuel cell stack may be diagnosed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Therefore, the technical scope of the present invention should be defined by the technical spirit and scope of the accompanying claims.

What is claimed is:

1. A method of diagnosing a fuel cell stack, comprising:
measuring, by a processor, current and voltage of a fuel cell stack during driving of a fuel cell vehicle and sequentially storing the current and voltage;
determining, by the processor, whether the vehicle is being operated at constant current by comparing a variance of the stored current with a preset reference variance value;
determining whether the fuel cell stack is in a normal state by comparing different factors with a preset reference value depending on whether the vehicle is being operated at constant current;
calculating, by the processor, a moisture supply into the fuel cell stack when determined that the fuel cell stack is not in the normal state;
diagnosing, by the processor, whether the fuel cell stack is in a dryout state by comparing the calculated moisture supply with a preset reference moisture supply value; and
controlling, by the processor an air supply system to increase a humidity of air supplied to the fuel cell stack or to decrease the air supply flow rate, or a cooling system of the fuel cell stack to forcibly cool the fuel cell stack, to increase the relative humidity inside of the fuel cell stack when diagnosed that the fuel cell slack is in the dryout state.

2. The method of claim 1, wherein determining whether the fuel cell stack is in the normal state is configured to, if it is determined that the vehicle is not being operated at constant current, calculate an internal resistance from a relationship between the current and the voltage and determine whether the calculated internal resistance is greater than a preset reference resistance.

3. The method of claim 2, wherein calculating the moisture supply into the fuel cell stack is performed if the calculated internal resistance is greater than the preset reference resistance.

4. The method of claim 1, wherein determining whether the fuel cell stack is in the normal state is configured to, if it is determined that the vehicle is being operated at constant current, measure a variation in an output voltage level of the fuel cell stack and determine whether the measured variation in the output voltage level is greater than a preset variation.

5. The method of claim 4, wherein calculating the moisture supply into the fuel cell stack is performed if the measured variation in the output voltage level is greater than the preset variation.

6. The method of claim 1, wherein the moisture supply into the fuel cell stack is calculated by integrating excessive or deficient moisture content obtained for a predetermined period of time, wherein the excessive or deficient moisture content is based on a moisture supply, a moisture discharge, and moisture content generated due to a chemical reaction within the fuel cell stack.

7. The method of claim 1, wherein diagnosing whether the fuel cell stack is in the dryout state is configured to diagnose that the fuel cell stack is in the dryout state if the moisture supply into the fuel cell stack is greater than a preset moisture supply.

8. The method of claim 1, wherein diagnosing whether the fuel cell stack is in the dryout state is configured to diagnose that the fuel cell stack is deteriorated if the moisture supply into the fuel cell stack is less than a preset moisture supply.

9. An apparatus, comprising:
a processor coupled to the network interfaces and adapted to execute one or more processes; and
a memory configured to store a process executable by the processor, the process when executed operable to:
measure current and voltage of a fuel cell stack during driving of a fuel cell vehicle and sequentially storing the current and voltage;
determine whether the vehicle is being operated at constant current by comparing a variance of the stored current with a preset reference variance value;
determine whether the fuel cell stack is in a normal state by comparing different factors with a preset reference value depending on whether the vehicle is being operated at constant current;
calculate a moisture supply into the fuel cell stack when determined that the fuel cell stack is not in the normal state;

diagnose whether the fuel cell stack is in a dryout state by comparing the calculated moisture supply with a preset reference moisture supply value; and control an air supply system to increase a humidity of air supplied to the fuel cell stack or to decrease the air supply flow rate, or a cooling system of the fuel cell stack to forcibly cool the fuel cell stack, to increase the relative humidity inside of the fuel cell stack when diagnosed that the fuel cell stack is in the dryout state.

10. The apparatus of claim 9, wherein the process when executed operable to determine whether the vehicle is being operated at constant current is configured to determine, based on a variance of the stored current, whether the vehicle is being operated at constant current.

11. The apparatus of claim 9, wherein the process when executed operable to determine whether the fuel cell stack is in the normal state is configured to, if it is determined that the vehicle is not being operated at constant current, calculate an internal resistance from a relationship between the current and the voltage and determine whether the calculated internal resistance is greater than a preset reference resistance.

12. The apparatus of claim 11, wherein the process when executed operable to calculate the moisture supply into the fuel cell stack is performed if the calculated internal resistance is greater than the preset reference resistance.

13. The apparatus of claim 9, wherein the process when executed operable to determine whether the fuel cell stack is in the normal state is configured to, if it is determined that the vehicle is being operated at constant current, measure a variation in an output voltage level of the fuel cell stack and determine whether the measured variation in the output voltage level is greater than a preset variation.

14. The apparatus of claim 13, wherein the process when executed operable to calculating the moisture supply into the fuel cell stack is performed if the measured variation in the output voltage level is greater than the preset variation.

15. The apparatus of claim 9, wherein the moisture supply into the fuel cell stack is calculated by integrating excessive or deficient moisture content obtained for a predetermined period of time, wherein the excessive or deficient moisture content is based on a moisture supply, a moisture discharge, and moisture content generated due to a chemical reaction within the fuel cell stack.

16. The apparatus of claim 9, wherein the process when executed operable to diagnose whether the fuel cell stack is in the dryout state is configured to diagnose that the fuel cell stack is in the dryout state if the moisture supply into the fuel cell stack is greater than a preset moisture supply.

17. The apparatus of claim 9, wherein the process when executed operable to diagnose whether the fuel cell stack is in the dryout state is configured to diagnose that the fuel cell stack is deteriorated if the moisture supply into the fuel cell stack is less than a preset moisture supply.

18. A non-transitory computer readable medium containing program instructions executed by a processor, the computer readable medium comprising:

program instructions that measure current and voltage of a fuel cell stack during driving of a fuel cell vehicle and sequentially storing the current and voltage;

program instructions that determine whether the vehicle is being operated at constant current by comparing a variance of the stored current with a preset reference variance value;

program instructions that determine whether the fuel cell stack is in a normal state by comparing different factors with a preset reference value depending on whether the vehicle is being operated at constant current;

program instructions that calculate a moisture supply into the fuel cell stack when determined that the fuel cell stack is not in the normal state;

program instructions that diagnose whether the fuel cell stack is in a dryout state by comparing the calculated moisture supply with a preset reference moisture supply value; and program instructions that control an air supply system to increase a humidity of air supplied to the fuel cell stack or to decrease the air supply flow rate, or a cooling system of the fuel cell slack to forcibly cool the fuel cell stack, to increase the relative humidity inside of the fuel cell stack when diagnosed that the fuel cell stack is in the dryout state.

* * * * *